United States Patent
Hauck et al.

(10) Patent No.: US 6,517,988 B1
(45) Date of Patent: Feb. 11, 2003

(54) RADIATION-SENSITIVE, POSITIVE WORKING COATING COMPOSITION BASED ON CARBOXYLIC COPOLYMERS

(75) Inventors: Gerhard Hauck, Badenhausen (DE); Mathias Jarek, Northeim (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 18 days.

(21) Appl. No.: 09/903,824

(22) Filed: Jul. 12, 2001

(51) Int. Cl.⁷ .............................. G03F 7/021; G03F 7/30
(52) U.S. Cl. ...................... 430/165; 430/191; 430/192; 430/193; 430/302
(58) Field of Search ................................ 430/165, 191, 430/192, 193, 302

(56) References Cited

U.S. PATENT DOCUMENTS

| | | | | |
|---|---|---|---|---|
| 2,861,058 A | 11/1958 | Unruh et al. | ............... | 260/78.5 |
| 3,802,885 A | 4/1974 | Lawson et al. | ................. | 96/75 |
| 3,847,614 A | 11/1974 | Mattor | ........................... | 96/75 |
| 4,079,041 A | 3/1978 | Baumann et al. | .............. | 260/63 |
| 4,631,245 A | 12/1986 | Pawlowski | ................... | 430/175 |
| 4,652,602 A | 3/1987 | Liu | ............................. | 524/449 |
| 4,741,985 A | 5/1988 | Aoai et al. | ................... | 430/175 |
| 4,895,788 A | 1/1990 | Walls et al. | ................. | 430/278 |
| 5,045,429 A | 9/1991 | Mack et al. | ................. | 430/175 |
| 5,112,743 A | 5/1992 | Kamiya et al. | .............. | 430/175 |
| 5,169,897 A | 12/1992 | Walls | ........................... | 525/61 |
| 5,275,907 A * | 1/1994 | Walls | ......................... | 430/157 |
| 5,376,496 A | 12/1994 | Elsaesser et al. | ............ | 430/165 |
| 5,582,952 A | 12/1996 | Kawamura et al. | ......... | 430/166 |
| 5,700,619 A | 12/1997 | Baumann et al. | ............ | 430/175 |
| 5,925,491 A * | 7/1999 | Baumann et al. | ............ | 430/175 |
| 5,928,841 A * | 7/1999 | Ushirogouchi et al. | ..... | 430/188 |
| 6,255,033 B1 * | 7/2001 | Levanon et al. | .......... | 430/271.1 |

FOREIGN PATENT DOCUMENTS

| | | |
|---|---|---|
| DE | 4426141 | 1/1995 |
| DE | 19936332 | 3/2001 |
| DE | 19936333 | 3/2001 |
| EP | 0544264 | 6/1993 |
| EP | 0702271 | 3/1996 |
| EP | 0722121 | 7/1996 |

* cited by examiner

Primary Examiner—John S. Chu
(74) Attorney, Agent, or Firm—RatnerPrestia

(57) ABSTRACT

A radiation-sensitive composition, positive-working coating compositions useful for the preparation of lithographic printing plates and lithographic printing plate precursors comprising the composition are disclosed. The composition comprises at least one quinonediazide compound and at least one carboxylic copolymer. The compositions produce lithographic printing plates that show high print run stability.

41 Claims, No Drawings

RADIATION-SENSITIVE, POSITIVE WORKING COATING COMPOSITION BASED ON CARBOXYLIC COPOLYMERS

FIELD OF THE INVENTION

This invention relates to radiation-sensitive, positive working coating compositions useful for the preparation of lithographic printing plates. In particular, this invention relates to coating compositions that produce lithographic printing plates that show high print run stability.

BACKGROUND OF THE INVENTION

The art of lithographic printing is based upon the immiscibility of oil and water, in which oily material or ink is preferentially retained by the image areas and the water or fountain solution is preferentially retained by the non-image areas of the printing plate. When a suitably prepared surface is moistened with water and ink is applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket, which in turn transfers the ink to the surface of the material upon which the image is to be reproduced.

Lithographic printing plates can be either negative working or positive working, and comprise one or more radiation-sensitive layers on a suitable substrate, such as a metal or polymeric support. The radiation-sensitive layer generally includes one or more radiation-sensitive components that may be dispersed in a suitable binder. Alternatively, the radiation-sensitive component can also be the binder material.

Upon exposure to light, the exposed areas of a negative working printing plate are hardened, leaving non-exposed areas removable during development. Negative working printing plates can be divided into two different types depending on the mechanism of "insolubilization" during exposure:

In the first type the presence of a diazonium compound in the radiation-sensitive composition is responsible for the insolubilization upon exposure to radiation. In the second type the radiation-sensitive composition contains a photocrosslinkable component which is subjected to crosslinking upon exposure to radiation, the crosslinking being responsible for the insolubilization. Certain negative working printing plates contain novolac resins, a cross-linking agent, and a radiation-sensitive component that produces acid on exposure.

An alkaline developable positive working printing plate generally has a light sensitive layer comprising a novolac resin and a radiation-sensitive component such as an o-diazoquinone or diazonaphthoquinone compound (see, for example Lawson, U.S. Pat. No. 3,802,885). Upon exposure to light the radiation-sensitive component is converted to the corresponding carboxylic acid. The use of an alkaline developer will remove only the exposed areas of the radiation-sensitive layer, releasing the surface of the support. Because the surface of the support is hydrophilic, the uncovered non-image area attracts water and repels the oily ink. The image area remaining after development is oleophilic thereby repelling water and attracting the printing ink.

Developers used for positive working precursors (hereafter abbreviated as positive developers) are characterized by a high pH value, i.e. a pH of clearly more than 10, usually in the range of about 12 to about 14. Compared thereto, developers used for negative working precursors (hereafter abbreviated as negative developers) have a relatively low pH value, i.e. around 10.

DE-A-44 26 141 discloses radiation-sensitive compositions comprising a naphthoquinonediazide compound and a polymeric binder obtained by polymerizing an unsaturated compound comprising an aromatic carboxyl ground (i.e. a carboxyl group bonded to a phenyl or naphthyl ring). A printing plate precursor comprising a radiation-sensitive layer of said composition can be developed after imagewise exposure with an aqueous alkaline developer having a pH of 12.5 or less. However, an improvement of the print run stability of printing plates obtained therefrom is desirable.

Today the demands on radiation-sensitive compositions used for the preparation of lithographic printing plates are quite high. Besides high sensitivity a high print run stability is required. For improving the print run stability of radiation-sensitive compositions and thus also of the corresponding printing plates, basically two methods have been pursued. One of them relates to the improvement of the components of the radiation-sensitive compositions especially the polymeric compounds ("binders") thereof which are supposed to control the physical properties of the radiation-sensitive layers like developability, scratch resistance and print run stability. The other one refers to the incorporation of particles into the radiation-sensitive layer for improving the print run stability.

Coating solutions for in-situ formation of particles in the radiation-sensitive layer during drying are for instance disclosed in the pending U.S. application Ser. No. 09/493,837 based on PCT/DE 99/016730.

The development of new binder materials is for instance described in EP-A-0 722 171, EP-A-0 544 264 and EP-A-0 440 086.

Therefore, a need exists for provide coating compositions for positive working printing plate precursors in which the radiation-sensitive composition contains only a very few components yet produces in a radiation-sensitive layer having high printrun stability. The coating composition should produce printing plates in which the ink-water balance can be reached faster and which show less problems after restart. In addition, the printing plate precursors should have reduced sludge formation in the developer. Sludge formation in the developer often occurs due to precipitation of silicates.

SUMMARY OF THE INVENTION

The invention is a radiation-sensitive composition comprising:

(a) at least one quinonediazide compound, and
(b) at least one copolymer comprising the units A, B, C and D, wherein:

unit A has the formula

wherein R is hydrogen or $C_1$–$C_4$ alkyl, unit B has the formula

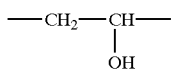

unit C has the formula

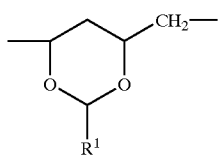

wherein $R^1$ is $C_1$–$C_4$ alkyl and unit D is a unit comprising at least one free carboxyl group selected from the group consisting of straight chain $C_1$–$C_4$ alkylenes having at least one carboxyl substituent, straight-chain $C_2$–$C_4$ alkenylenes having at least one carboxyl substituent, divalent groups represented by formula (D1),

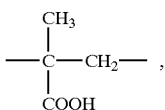

divalent groups represented by formula (D2),

and divalent groups represented by formula (D3)

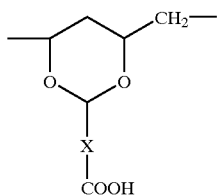

where X is selected from the group consisting of phenylene, phenylenes substituted with one or more $C_1$–$C_4$ alkyl groups, benzofused phenylenes, and divalent groups of the following formula

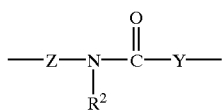

where Z is an aliphatic, aromatic or araliphatic spacer group, $R^2$ is hydrogen or an aliphatic, aromatic or araliphatic group, and Y is a saturated or unsaturated chain-or ring-shaped spacer group.

Preferably the carboxylic copolymer comprises 0.5 to 25 mol % of unit A, 30 to 55 mol % of unit B, 25 to 65 mol % of unit C, and 1 to 10 mol % of unit D.

In another aspect, the invention is a printing plate precursor, sometimes called printing plate or a printing form, comprising the radiation-sensitive composition. In another aspect, the invention is a method for forming an image useful as a printing late using the printing plate precursor. In yet another aspect, the invention is a printing plate formed by the method of the invention.

DETAILED DESCRIPTION OF THE INVENTION

The radiation-sensitive composition of the invention comprises two essential components: a quinonediazide compound and a polymeric binder.

Examples of suitable quinonediazide compounds are benzoquinonediazide (BQD) compounds and naphthoquinonediazide (NQD) compounds. A BQD compound may, for example, comprise a 1,4- or, preferably 1,2-benzoquinonediazide. A NQD compound may, for example, comprise a 1,4-, 2,1- or, most preferably, 1,2-naphthoquinonediazide. Generally, NQDs are preferred to BQDs. Most preferred is 1,2-naphthoquinonediazide. The composition can comprise a BQD or NQD ester of a phenolic polymeric substance or a BQD or NQD compound, for example an ester, and optionally a phenolic polymeric substance in admixture. The preferred esters are sulfonate esters.

Examples of naphthoquinonediazide compounds that may be used are disclosed in a variety of publications, such as, for example, Chapter 5 of *Photoreactive Polymers: the Science and Technology of Resists,* A. Reiser, Wiley, New York, 1989, pp. 178-225. Among these, preferred are o-naphthoquinone diazido sulfonates or o-naphthoquinonediazide carboxylates of aromatic hydroxyl compounds; o-naphtho-quinone diazido sulfonic acid amides or o-naphthoquinonediazide carboxylic acid amides of aromatic amine compounds, for instance, esters of naphthoquinone-1,2-diazido sulfonic acid with polyhydroxyphenyl; esters of naphthoquinone-1,2-diazido4-sulfonic acid or naphthoquinone-1,2-diazido-5-sulfonic acid with pyrogallol/acetone resins; esters of naphthoquinone-1,2-diazidosulfonic acid with novolac-type phenol/-formaldehyde resins or novolac-type cresol/formaldehyde resins; amides of poly(p-aminostyrene) and naphthoquinone-1,2-diazido-4-sulfonic acid or naphthoquinone-1,2-diazido-5-sulfonic acid; esters of poly (p-hydroxystyrene) and naphthoquinone-1,2-diazido4-sulfonic acid or naphthoquinone-1,2-diazido-5-sulfonic acid; and amides of polymeric amines with naphthoquinone-1,2-diazido4-sulfonic acid. The term "ester" used herein also includes partial esters.

Although it is sufficient that only one kind of diazo compound is present in the radiation-sensitive composition, it is within the scope of the invention to use a mixture of two are more kinds of quinonediazide compounds.

The quinonediazide compound is preferably present in the radiation-sensitive composition in an amount of about 5 to 50 wt % based on the total solid content of the composition, more preferably about 15 to 35 wt %.

The polymeric binder contains free carboxyl groups; preferably the binder has an acid number of about 10 to about 150 mg KOH/g, more preferably about 10 to 100 mg KOH/g, most preferably about 10 to 40 mg KOH/g.

The copolymer is preferably present in an amount of about 10 to 90 wt % based on the total solid content of the composition, more preferably about 25 to 75 wt %. The copolymer comprises units A, B and C represented by the following formulae (A)  —CH₂—CH—
              |
              OCOR (B)  —CH₂—CH—
              |
              OH (C) 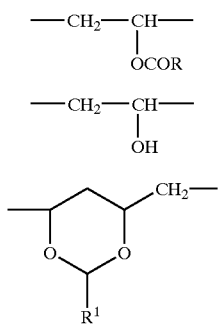

and further comprises unit D which comprises at least one free carboxyl group.

Preferably, unit A is present in an amount of about 0.5 to 25 mol %, more preferably about 1 to 10 mol %. The amount of unit B is preferably about 30 to 55 mol %, more preferably about 30 to 40 mol %, even more preferably about 33 to 38 mol %. Unit C is preferably present in an amount of about 25 to 65 mol %, more preferably about 30 to 60 mol %. Unit D is preferably present in an amount of about 1 to 10 mol %, more preferably about 3 to 6 mol %.

In formula (A) R is hydrogen or $C_1$–$C_4$ alkyl, preferably ethyl. In formula (C) $R^1$ is $C_1$–$C_4$ alkyl, preferably ethyl or butyl.

Unit D is selected from the group consisting of unit D1, unit D2, unit D3, straight-chain $C_1$–$C_4$ alkylene groups comprising at least one —COOH substituent, and straight-chain $C_2$–$C_4$ alkenylene groups comprising at least one —COOH substituent, wherein units D1, D2 and D3 are represented by the following formulae (D1)
```
       CH₃
        |
    —C—CH₂—
        |
       COOH
```

(D2)  —CH₂—CH—
                |
                OCOCH=CHCOOH (D3) 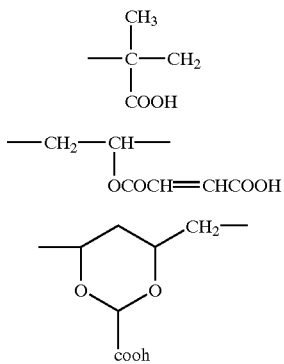

wherein X is selected from the group consisting of phenylene, phenylenes substituted with one or more C1–C4 alkyl groups, benzofused phenylenes and divalent groups of the following formula

```
              O
              ||
    —Z—N—C—Y—
         |
         R²
``` where Z is an aliphatic, aromatic or araliphatic spacer group; $R^2$ is hydrogen or an aliphatic, aromatic or araliphatic group; and Y is a saturated or unsaturated chain- or ring-shaped spacer group. Y is typically a divalent saturated or unsaturated, substituted or unsubstituted open chain group, preferably comprising a chain of 2 to 4 carbon atoms; or a divalent substituted or unsubstituted monocyclic or bicyclic group, preferably comprising 6 to 10 atoms in the monocyclic or bicyclic group, of which up to two may be heteroatoms, preferably heteroatoms selected from the group consisting of oxygen, nitrogen, and sulfur, and the remainder are carbon atoms.

Z is preferably an aliphatic spacer group, more preferably it is selected from the group consisting of —CH₂—, —CH(CH₃)— and —CH₂CH₂CH₂—.

Y is preferably a divalent group selected from the group consisting of —CR³R⁴—CR⁵R⁶—, —CR³=CR⁴—

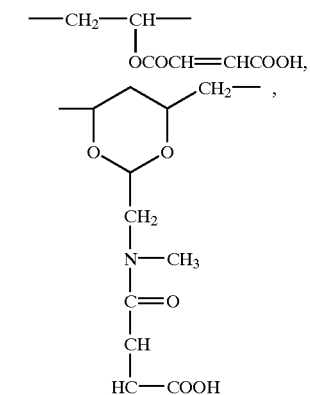

wherein $R^3$, $R^4$, $R^5$, $R^6$ each are independently selected from the group consisting of hydrogen and alkyl having 1 to 4 carbon atoms.

$R^2$ is preferably alkyl, more preferably methyl.

X is preferably selected from the group consisting of $C_1$–$C_4$ alkyl, more preferably methyl.

Each unit A present in a molecule can be the same or different. The same applies to units C and D.

Preferably unit D is selected from the group consisting of

—CH₂—CH—
        |
        OCOCH=CHCOOH,

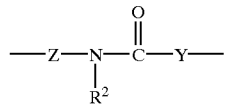

```
              CH₂
               |
               N—CH₃
               |
               C=O
               |
               CH
               |
           HC—COOH
```

-continued

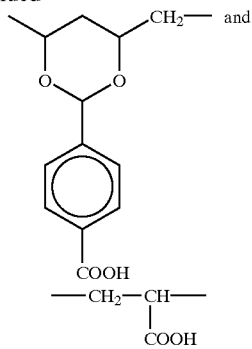

The carboxylic copolymers may be prepared by the reaction of a cyclic anhydride, such as maleic anhydride, with a polymer that contains hydroxyl group but no further hydroxyl groups that are capable of reaction with acid anhydrides, such as partially hydrolyzed vinyl butryal/vinyl acetate copolymers. The synthesis of carboxylic copolymers is disclosed in Mack, U.S. Pat. No. 5,045,429, and Pawlowski, U.S. Pat. No. 4,631,245. D3 units are disclosed in Walls, U.S. Pat. No. 5,169,897, and Baumann, U.S. Pat. No. 5,700,619. Suitable carboxylic copolymers are commercially available from, for example, Clariant International Ltd. (Muttenz, Switzerland).

The vinyl acetate copolymers that serve as starting material for the preparation of the carboxylic copolymers used in the invention are usually 70 to 98 mol % hydrolyzed and have a weight-average molecular weight Mw of 20,000 to 130,000 g/mol. Which copolymer is used as starting material for the synthesis depends on the intended use of the photosensitive composition. If offset lithographic plates are to be produced, polymers with a weight-average molecular weight Mw of 35,000 to 130,000 g/mol and a hydrolysis degree of the vinyl acetate structural unit of 80 to 98 mol % are preferably used.

In addition to the essential components the radiation-sensitive composition may optionally also comprise one of more phenolic resins, crosslinkers, coloring agents preferably dyes, plasticizers and exposure indicators.

Suitable phenolic resins are novolac resins and resole resins. Novolac resins useful in this invention, suitably are condensation reaction products between appropriate phenols, for example phenol itself, C-alkyl substituted phenols (including resols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolacs, which are thermoplastic in character.

Higher aldehyde:phenol ratios of more than 1:1 to 3:1, and a basic catalyst would give rise to a class of phenolic resins known as resoles. Resoles are characterized by their ability to be thermally hardened at elevated temperatures. Besides a single resin also combinations of two or more kinds of phenolic resins can be used. If a phenolic resin is present in the radiation-sensitive composition of the invention its amount preferably ranges from about 1 to 70 wt % based on the total solid content of the composition, more preferably about 5 to 40 wt %.

The substrate to be used for the preparation of printing plate precursors is preferably a material in the form of a sheet or a film, having a good dimensional stability. As such a dimensionally stable sheet or film material, use is preferably made of a material that has already been used as support of printing plate precursors; examples thereof include paper, paper coated with plastic materials (such as polyethylene, polypropylene, polystyrene), metal sheets or foils, such as e.g. aluminum (including aluminum alloys), zinc and copper sheets, plastic films made from e.g. cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate and polyvinylacetate, and a laminate comprising paper or a plastic film and one of the above-mentioned metals or a paper/plastic film which has been metallized by chemical vapor deposition. Among these carriers, an aluminum sheet or foil is especially preferred because it has a remarkable dimensional stability, is inexpensive and furthermore shows an excellent adhesion of the radiation-sensitive layer. Furthermore, a composite film can be used wherein an aluminum foil has been laminated onto a polyethylene terephthalate film.

The substrate for preparing lithographic printing plates may be pretreated prior to the application of said radiation-sensitive composition. Where the support material is a metal, especially aluminum, it may be pretreated by one or more conventional methods used in the surface treatment of aluminum, for example caustic etch cleaning, acid cleaning, brush graining, mechanical graining, slurry graining, sand blasting, abrasive cleaning, electrocleaning, solvent degreasing, ultrasonic cleaning, alkali nonetch cleaning, primer coating, grit/shot blasting and electrograining. Details of such methods are well-known to the person skilled in the art.

The grained plates, which were optionally anodically oxidized in sulfuric or phosphoric acid, can then be subjected to a hydrophilizing aftertreatment, preferably in aqueous solutions of polyvinyl phosphonic acid, sodium silicate or phosphoric acid. The details of the above-mentioned substrate pretreatment are well-known to the person skilled in the art.

The optionally pretreated substrates are solvent coated with the radiation-sensitive compositions of the invention by using organic solvents and/or solvent mixtures. Typically the ingredients are dispersed or dissolved in a suitable coating solvent, and the resulting mixtures coated by conventional methods, such as spin coating, bar coating, gravure coating, or roller coating. A drying step, i.e., drying the radiation-sensitive layer to remove coating solvent may also be used in desired. The dry layer weight is preferably from 0.5 to 4 g/m$^2$, more preferably from 0.8 to 3 g/m$^2$.

In few cases, the additional application of an oxygen-impermeable top layer to the photosensitive layer may be advantageous. The polymers suitable for the top layer include polyvinyl alcohol, polyvinyl alcohol/polyvinyl acetate copolymers, polyvinyl pyrrolidone, polyvinyl pyrrolidone/ polyvinyl acetate copolymers and gelatine. The layer weight of the oxygen-impermeable top layer is preferably 0.1 to 4 g/m$^2$, and more preferably 0.3 to 2 g/m$^2$. However, the lithographic plates produced using the photosensitive compositions of the invention do have excellent properties even without a top layer.

The resulting lithographic plates are exposed to ultraviolet light as known to the person skilled in the art. The element is imagewise exposed to radiation from a source of light that is absorbed by the photoreactive component or components of the top layer, such as a carbon arc lamp, a mercury lamp, a xenon lamp, a tungsten lamp, a metal halide lamp, or a laser emitting at the appropriate wavelength. Diazonaphthoquinone compounds substituted in the 5-position typically absorb at 345 nm and 400 nm. Diazonaphthoquinone compounds substituted in the 4-position typically absorb at 310 nm and 380 nm. Imagewise exposure is typically carried out through a photomask, but direct digital exposure with a laser emitting at the appropriate wavelength is also possible.

If no or only a small amount (up to about 10 wt %) of phenolic resin or resins are present in the composition, the imagewise-exposed printing plate precursors are developable by either positive or negative developers. Positive developers typically have a high pH value, more than 10, usually in the range of about 12 to about 14. Negative have a relatively low pH value, i.e. around 10.

Typically, the imagewise-exposed printing plate precursor is contacted with the developer by dipping the precursor into the developer or by rubbing or wiping the radiation-sensitive layer with an applicator containing the developer. Alternatively, the radiation-sensitive layer may be brushed with the developer or developer may be applied to the exposed precursor by spraying the radiation-sensitive layer with sufficient force to remove the exposed regions. The developing step may be carried out in a commercially available processor, such as a TDP 60 (Kodak Polychrome Graphics).

The developed plates are usually treated with a preservative ("rubber coating"). The preservatives are aqueous solutions of hydrophilic polymers, wetting agents and other additives.

Industrial Applicability

The positive-working radiation-sensitive compositions produce printing plates showing a high print run stability. If the composition comprises about 10 wt % or less of phenolic resin, exposed printing plate precursors are developable by either positive or negative developers, which is sometimes advantageous. In cases where customers are primarily using negative working plates, no separate processor and developer are needed for the positive working plates. By the use of phenolic resins the print run stability can sometimes be further improved.

Although the radiation sensitive compositions are preferably usable for producing lithographic plates, however, they may be used in recording materials for creating images on suitable carriers and receiving sheets, for creating relieves that may serve as printing molds, screens and the like, as light-hardening varnishes for surface protection and for the formulation of ultraviolet-hardening printing inks.

The following examples describe the invention in more detail without limiting it.

EXAMPLES

Example 1

Preparation of Lithographic Printing Plate Precursor

An aluminum substrate subjected to electrolytic graining, anodizing and interlayering with polyvinylphosphonic acid (i.e. a substrate that is used for conventional positive plates) is coated with the following solution to a dry coating weight of 2 g/m$^2$:68.5 w/w % of a carboxylic polymer that can typically be used for negative coatings with the following composition (in mol %):vinyl alcohol (35.9), vinyl acetacetal (16.), vinyl butyral (30.3), vinyl acetate (7.7), and acrylic acid (acid number 16.9 (3.1); 30 w/w % of 1,5-naphthoquinonediazide sulfonic acid diester of 2,4-dihydroxybenzophenone; 1% w/w % ethyl violet dye ([(p-(CH$_3$CH$_2$)$_2$NC$_6$H$_4$)$_3$C$^+$Cl$^-$]); and 0.5% w/w % triazine B (2,4-bis(trichloromethyl)-6-(4-methoxy-1-naphthyl)-1,3,5-triazine; (Panchim, Lisses, France).

The components were dissolved at 10 w/w % in a solvent mixture of: 50 w/w % methyl lactate, 25 w/w % methanol, and 25 w/w % dioxolane. The coated plate was dried at 100° C. for 10 minutes.

Evaluation of the Plate Precursor

The resistance to diacetone alcohol was tested visually. Slight attack was observed after 10 seconds.

Exposure was carried out in a vacuum frame with a 715 mJ/cm$^2$ exposure from a 5 kV ultraviolet light source through a UGRA step wedge.

Development with developer 952 (a negative developer available from Kodak Polychrome Graphics, having a pH of 10) at 20° C. by 15 seconds dipping and 5 seconds rubbing gave a positive image, i.e. the non-exposed areas remained and the exposed areas developed off giving a clean non-image area. The gray scale showed a free step 3.

Development with developer 2000M (a positive developer available from Kodak Polychrome Graphics having a pH of about 13.5) at 20° C. by 15 seconds dipping and 5 seconds rubbing gave a positive image, i.e. the non-exposed areas remained and the exposed areas developed off giving a clean non-image area. The gray scale showed a free step 1.

This example shows that layers obtained with compositions comprising a carboxylic polymer but no phenolic resin can be developed with positive and negative developers.

Examples 2 to 4

Example 1 was repeated by using coating compositions as shown in Table 1 below. The dry coating weight was, however, only 1.1 g/m$^2$.

TABLE 1

|  | Example 2 | Example 3 | Example 4 |
|---|---|---|---|
| Copolymer[1] | — | — | 69 |
| LP-RF143[2] | 15 | 30 | — |
| PD140A[3] | 54 | 39 | 5 |
| triazine B | 0.5 | 0.5 | 0.5 |
| ethyl violet | 1.5 | 1.5 | 1.5 |
| POSYLUX ® 2402[4] | 24 | 24 | 24 |
| CELLOBOND ®[5] | 5 | 5 | 5 |
| Σ | 100 wt % | 100 wt % | 100 wt % |

[1]Copolymer with vinyl alcohol content of 36 mol %, vinyl acetate content of 1.5 mol %, 39.4 mol % vinyl butyral, 17.4 mol % vinyl acetacetal and 5.7 mol %

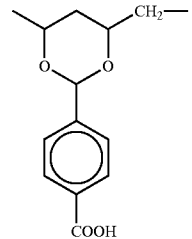

[2]copolymer (vinyl alcohol content 35.9 mol %; vinyl acetate content 1.5 mol %; 37.3 mol % vinyl butyral; 16 mol % vinyl acetacetal and 3.1 mol % acrylic acid) (Clariant, Muttenz, Switzerland)
[3]cresol/formaldehyde novolac resin (75:25 m-cresol/p-cresol) (Borden Chemical, Columbus, OH, U.S.A.)
[4]p-cresol-formaldehyde novolac highly esterified with 2,1,4-naphthoquinonediazide sulfonic acid; available from PCAS
[5]phenol-formaldehyde novolac available from BP Chemicals (Mw about 4,800)

The printing plate precursors were exposed with 180 units in an exposure frame (from Sack, LCX3) using a metal halide burner and developed with the developer UNIDEV ® available from Agfa (this developer is suitable for both positive and negative working plates).

For comparison a VIRAGE ® printing plate precursor available from Kodak Polychrome Graphics was exposed with 160 units and developed with developer 2000M available from Kodak Polychrome Graphics.

Press Test

The developed plates were transferred to a printing press (Roland 200 available from MAN). The results were as follows:

Ink pick-up was good with all plates and after machine stop no restart toning was observed.

Wear of solids: At 100,000 impressions ink was removed from plates and the plates were checked with a magnifying glass. The VIRAGE® coating (comparison) looked strongly worn on the "tail" (where the plate first contacts the blanket and print on paper starts) whereas the plate of Example 2 was only slightly worn; the plates of Examples 3 and 4 did scarcely look worn at all. Inked wear was only visible on the VIRAGE® coating.

At 110,000 impressions: The tail showed wear (inked) on the VIRAGE® coating and the plate of Example 2. At 140,000 impressions: The tail showed wear (inked) on the plate of Example 4. At 170,000 impressions: The tail showed wear (inked) on the plate of Example 3.

The coating loss was gravimetrically measured after 170,000 impressions (values in % of coating weight) and the loss on press was measured with a Primisil/Plynometer. For the plynometer abrasion test, a slurry of Primisil 511 (available from Lehmann & Voss) was used as abrasion liquid and the loss of coating was determined gravimetrically after 10 minutes of rubbing.

The results are shown in Table 2 below:

| Plate | Loss after 170,000 impressions | Loss on press |
| --- | --- | --- |
| VIRAGE ® | 45% of 2.2 g/m² | 2.30 g/m² (100%) |
| Example 4 | 0% of 1.1 g/m² | 0.47 |
| Example 3 | 20% of 1.1 g/m² | 0.47 |
| Example 2 | 20% of 1.1 g/m² | 0.26 (24%) |

Wear of microlines: Strongest wear occurred on the plate of Example 4 followed by the VIRAGE® plate; best was the plate of Example 3.

SEM pictures of Examples 3 and 4 did not reveal any difference between printed and non-printed area, while the VIRAGE® plate looked strongly worn.

Having described the invention, we now claim the following and their equivalents.

What is claimed is:

1. A radiation-sensitive composition comprising:

(a) at least one quinonediazide compound, and
   (b) at least one copolymer comprising the units A, B, C and D, wherein:

unit A has the formula

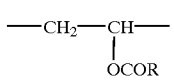

(A)

wherein R is hydrogen or $C_1$–$C_4$ alkyl,
unit B has the formula

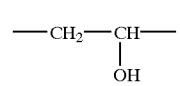

(B)

unit C has the formula

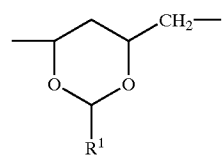

(C)

wherein $R^1$ is $C_1$–$C_4$ alkyl and
unit D is a unit comprising at least one free carboxyl group selected from the group consisting of straight chain $C_1$–$C_4$ alkylenes having at least one carboxyl substituent, straight-chain $C_2$–$C_4$ alkenylenes having at least one carboxyl substituent, divalent groups represented by formula D1,

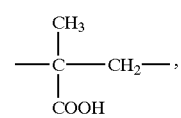

(D1)

divalent groups represented by formula (D2),

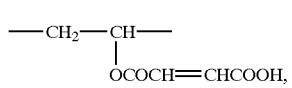

(D2)

and divalent groups represented by formula (D3)

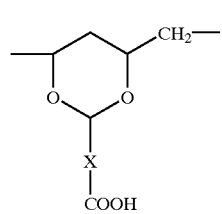

(D3)

where X is selected from the group consisting of phenylene, phenylenes substituted with one or more $C_1$–$C_4$ alkyl groups, benzofused phenylenes, and divalent groups of the following formula

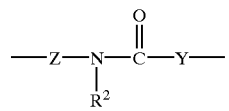

where Z is an aliphatic, aromatic or araliphatic spacer group, $R^2$ is hydrogen or an aliphatic, aromatic or araliphatic group, and Y is a saturated or unsaturated chain- or ring-shaped spacer group.

2. The composition of claim 1 further comprising at least one member selected from the group consisting of phenolic resins, crosslinkers, colorants, exposure indicators and plasticizers.

3. The composition of claim 1 in which the copolymer comprises 0.5 to 25 mol % of unit A, 30 to 55 mol % of unit B, 25 to 65 mol % of unit C, and 1 to 10 mol % of unit D.

4. The composition of claim 1 in which the copolymer has an acid number of about 10 to about 150 mg KOH/g.

5. The composition of claim 1 in which the quinonediazide compound is present in an amount of about 5 to about 50 wt % based on the total solid content of the composition.

6. The composition of claim 1 in which in the copolymer is present in an amount of about 10 to about 90 wt % based on the total solid content of the composition.

7. The composition of claim 1 in which the at least one quinonediazide compound is selected from the group consisting of benzoquinonediazides and naphthoquinonediazides.

8. The composition of claim 1 in which the composition additionally comprising from about 1 to about 70 wt %, based on the total solid content of the composition, of at least one phenolic resin.

9. The composition of claim 1 in which the composition comprises less than about 10 wt %, based on the total solid content of the composition, of phenolic resins.

10. The composition of claim 1 in which unit A comprises about 1 to 10 mol % off the copolymer; unit B comprises about 30 to 40 mol % of the copolymer; unit C comprises about 30 to 60 mol % of the copolymer; and unit D comprises about 3 to 6 mol % of the copolymer.

11. The composition of claim 10 in which:
the at least one quinonediazide compound is selected from the group consisting of benzoquinonediazides and naphthoquinonediazides;
the quinonediazide compound is present in an amount of about 15 to about 35 wt % based on the total solid content of the composition; and
the copolymer is present in an amount of about 25 to about 75 wt % based on the total solid content of the composition.

12. The composition of claim 11 in which the composition additionally comprising from about 1 to about 70 wt %, based on the total solid content of the composition, of at least one phenolic resin.

13. The composition of claim 11 in which the composition comprises less than about 10 wt %, based on the total solid content of the composition, of phenolic resins.

14. A method for preparing a printing plate precursor comprising:
coating a substrate with a radiation-sensitive composition, the radiation-sensitive composition comprising:
(a) at least one quinonediazide compound, and
(b) at least one copolymer comprising the units A, B, C and D,
wherein:
unit A has the formula

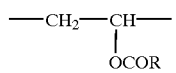

(A)

wherein R is hydrogen or $C_1$–$C_4$ alkyl,
unit B has the formula

(B)

unit C has the formula

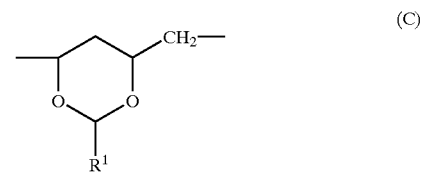

(C)

wherein $R^1$ is $C_1$–$C_4$ alkyl and
unit D is a unit comprising at least one free carboxyl group selected from the group consisting of straight chain $C_1$–$C_4$ alkylenes having at least one carboxyl substituent, straight-chain $C_2$–$C_4$ alkenylenes having at least one carboxyl substituent, divalent groups represented by formula D1,

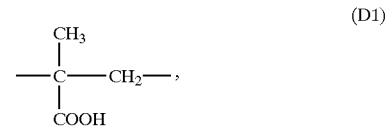

(D1)

and divalent groups represented by formula D2,

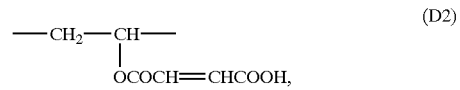

(D2)

and divalent groups represents by formula D3

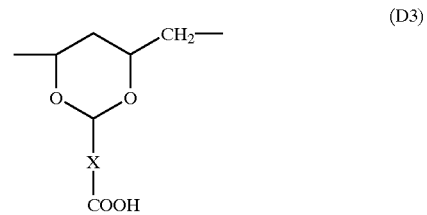

(D3)

where X is selected from the group consisting of phenylene, phenylenes substituted with one or more $C_1$–$C_4$ alkyl groups, benzofused phenylenes, and divalent groups of the following formula

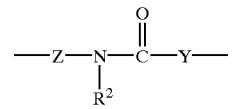

where Z is an aliphatic, aromatic or araliphatic spacer group, $R^2$ is hydrogen or an aliphatic, aromatic or araliphatic group, and Y is a saturated or unsaturated chain-or ring-shaped spacer group.

15. The method of claim 14 in which the composition further comprises at least one member selected from the group consisting of phenolic resins, crosslinkers, colorants, exposure indicators and plasticizers.

16. The method of claim 14 in which the copolymer comprises 0.5 to 25 mol % of unit A, 30 to 55 mol % of unit B, 25 to 65 mol % of unit C, and 1 to 10 mol % of unit D.

17. The method of claim 14 in which the copolymer has an acid number of about 10 to about 150 mg KOH/g.

18. The method of claim 14 in which the quinonediazide compound is present in the composition an amount of about 5 to about 50 wt % based on the total solid content of the composition.

19. The method of claim 14 in which in the copolymer is present in the composition in an amount of about 10 to about 90 wt % based on the total solid content of the composition.

20. The method of claim 14 in which the at least one quinonediazide compound is selected from the group consisting of benzoquinonediazides and naphthoquinonediazides.

21. The method of claim 14 in which the composition additionally comprising from about 1 to about 70 wt %, based on the total solid content of the composition, of at least one phenolic resin.

22. The method of claim 14 in which the composition comprises less than about 10 wt %, based on the total solid content of the composition, of phenolic resins.

23. The method of claim 14 in which unit A comprises about 1 to 10 mol % off the copolymer; unit B comprises about 30 to 40 mol % of the copolymer; unit C comprises about 30 to 60 mol % of the copolymer; and unit D comprises about 3 to 6 mol % of the copolymer.

24. The method of claim 23 in which:
the at least one quinonediazide compound is selected from the group consisting of benzoquinonediazides and naphthoquinonediazides;
the quinonediazide compound is present in an amount of about 15 to about 35 wt % based on the total solid content of the composition; and
the copolymer is present in an amount of about 25 to about 75 wt % based on the total solid content of the composition.

25. The method of claim 24 in which the composition additionally comprising from about 1 to about 70 wt %, based on the total solid content of the composition, of at least one phenolic resin.

26. The method of claim 24 in which the composition comprises less than about 10 wt %, based on the total solid content of the composition, of phenolic resins.

27. The method of claim 24 in which the radiation-sensitive composition is coated at a dry coating weight of 0.5 to 4 g/m².

28. A lithographic printing plate precursor prepared by a method comprising coating a substrate with a radiation-sensitive composition comprising:
(a) at least one quinonediazide compound, and
(b) at least one copolymer comprising the units A, B, C and D,
wherein:
unit A has the formula

(A)

wherein R is hydrogen or $C_1$–$C_4$ alkyl,
unit B has the formula

(B)

unit C has the formula

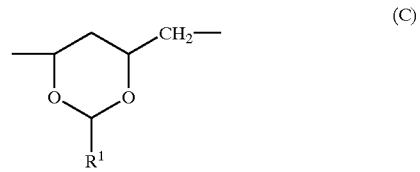

(C)

wherein $R^1$ is $C_1$–$C_4$ alkyl and
unit D is a unit comprising at least one free carboxyl group selected from the group consisting of straight chain $C_1$–$C_4$ alkylenes having at least one carboxyl substituent, straight-chain $C_2$–$C_4$ alkenylenes having at least one carboxyl substituent, divalent groups represented by formula D1,

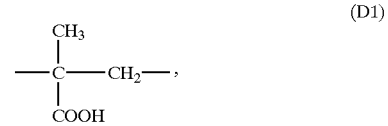

(D1)

divalent groups represented by formula D2,

(D2)

and divalent groups represented by formula D3

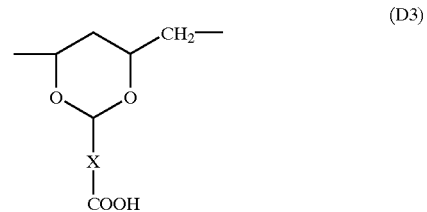

(D3)

where X is selected from the group consisting of phenylene, phenylenes substituted with one or more $C_1$–$C_4$ alkyl groups, benzofused phenylenes, and divalent groups of the following formula

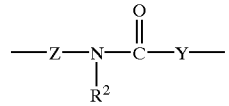

where Z is an aliphatic, aromatic or araliphatic spacer group, $R^2$ is hydrogen or an aliphatic, aromatic or araliphatic group, and Y is a saturated or unsaturated chain-or ring-shaped spacer group.

29. The precursor of claim 28 in which the substrate is an aluminum substrate that has been subjected to at least one of the following treatments: (1) mechanical graining, (2) electrochemical graining, (3) anodizing, and (4) hydrophilizing.

30. The precursor of claim 28 in which the copolymer comprises 0.5 to 25 mol % of unit A, 30 to 55 mol % of unit B, 25 to 65 mol % of unit C, and 1 to 10 mol % of unit D.

31. The precursor of claim 28 in which the composition further comprises at least one member selected from the group consisting of phenolic resins, crosslinkers, colorants, exposure indicators and plasticizers.

32. The precursor of claim 28 in which the composition additionally comprising from about 1 to about 70 wt %, based on the total solid content of the composition, of at least one phenolic resin.

33. The precursor of claim 28 in which unit A comprises about 1 to 10 mol % off the copolymer; unit B comprises about 30 to 40 mol % of the copolymer; unit C comprises about 30 to 60 mol % of the copolymer; and unit D comprises about 3 to 6 mol % of the copolymer.

34. The precursor of claim 33 in which:
- the at least one quinonediazide compound is selected from the group consisting of benzoquinonediazides and naphthoquinonediazides;
- the quinonediazide compound is present in an amount of about 15 to about 35 wt % based on the total solid content of the composition; and
- the copolymer is present in an amount of about 25 to about 75 wt % based on the total solid content of the composition.

35. A method for forming a printing plate, the method comprising:
- exposing imagewise a printing plate precursor and forming an exposed printing plate precursor; and
- developing the exposed printing plate precursor with a developer and forming the printing plate;

in which:
- the printing plate precursor is exposed with ultraviolet radiation;
- the printing plate precursor comprises a radiation-sensitive composition on a support;
- the exposed printing plate precursor comprises exposed and unexposed regions;
- the developer removes the exposed regions;
- the radiation-sensitive composition comprises:
  (a) at least one quinonediazide compound, and
  (b) at least one copolymer comprising the units A, B, C and D,
  wherein:
  unit A has the formula

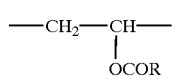

(A)

wherein R is hydrogen or $C_1$–$C_4$ alkyl,
unit B has the formula

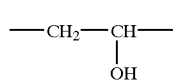

(B)

unit C has the formula

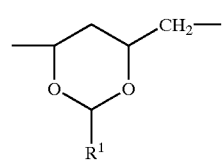

(C)

wherein $R^1$ is $C_1$–$C_4$ alkyl and
unit D is a unit comprising at least one free carboxyl group selected from the group consisting of straight chain $C_1$–$C_4$ alkylenes having at least one carboxyl substituent, straight-chain $C_2$–$C_4$ alkenylenes having at least one carboxyl substituent, divalent groups represented by formula D1,

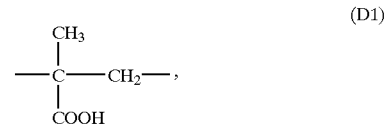

(D1)

divalent groups represented by formula D2,

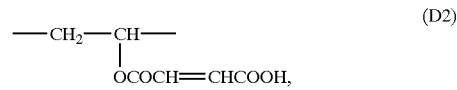

(D2)

and divalent groups represented by formula D3

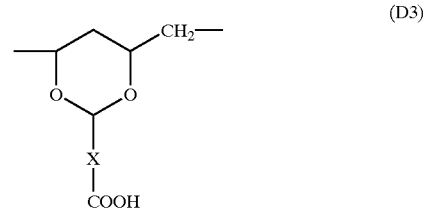

(D3)

where X is selected from the group consisting of phenylene, phenylenes substituted with one or more $C_1$–$C_4$ alkyl groups, benzofused phenylenes, and divalent groups of the following formula

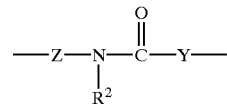

where Z is an aliphatic, aromatic or araliphatic spacer group, $R^2$ is hydrogen or an aliphatic, aromatic or araliphatic group, and Y is a saturated or unsaturated chain- or ring-shaped spacer group.

36. The method of claim 35 in which radiation-sensitive composition comprises less than about 10 wt %, based on the total solid content of the composition, of phenolic resins and the developer is a negative developer.

37. The method of claim 36 in which the copolymer comprises 0.5 to 25 mol % of unit A, 30 to 55 mol % of unit B, 25 to 65 mol % of unit C, and 1 to 10 mol % of unit D.

38. The method of claim 35 in which the developer is a positive developer.

39. The method of claim 35 in which:

unit A comprises about 1 to 10 mol % off the copolymer; unit B comprises about 30 to 40 mol % of the copolymer; unit C comprises about 30 to 60 mol % of the copolymer; and unit D comprises about 3 to 6 mol % of the copolymer;

the at least one quinonediazide compound is selected from the group consisting of benzoquinonediazides and naphthoquinonediazides;

the quinonediazide compound is present in an amount of about 15 to about 35 wt % based on the total solid content of the composition; and the copolymer is present in an amount of about 25 to about 75 wt % based on the total solid content of the composition.

40. The method of claim 39 in which the developer is a positive developer.

41. The method of claim 39 in which radiation-sensitive composition comprises less than about 10 wt %, based on the total solid content of the composition, of phenolic resins and the developer is a negative developer.

* * * * *

UNITED STATES PATENT AND TRADEMARK OFFICE
CERTIFICATE OF CORRECTION

PATENT NO. : 6,517,988 B1
DATED : February 11, 2003
INVENTOR(S) : Gerhard Hauck and Mathias Jarek It is certified that error appears in the above-identified patent and that said Letters Patent is hereby corrected as shown below:

Column 13,
Lines 19 and 44, delete "comprising" and insert -- comprises --
Line 27, delete "off" and insert -- of --

Column 14,
Line 31, delete "and"
Line 38, delete "represents" and insert -- represented --

Column 15,
Line 11, delete "in the" and insert -- the --
Line 19, delete "comprising" and insert -- comprises --
Line 27, delete "off" and insert -- of --
Line 43, delete "comprising" and insert -- comprises --

Column 17,
Line 10, delete "comprising" and insert -- comprises --

Column 19,
Line 2, delete "off" and insert -- of --

Signed and Sealed this

Twenty-ninth Day of July, 2003

JAMES E. ROGAN
*Director of the United States Patent and Trademark Office*